United States Patent
Zhang et al.

(10) Patent No.: US 11,765,860 B2
(45) Date of Patent: Sep. 19, 2023

(54) ELECTRONIC DEVICE

(71) Applicant: BEIJING XIAOMI MOBILE SOFTWARE CO., LTD., Beijing (CN)

(72) Inventors: Bo Zhang, Beijing (CN); Duzi Huang, Beijing (CN); Mingyan Liu, Beijing (CN); Kailiang Zhao, Beijing (CN)

(73) Assignee: BEIJING XIAOMI MOBILE SOFTWARE CO., LTD, Beijing (CN)

(*) Notice: Subject to any disclaimer, the term of this patent is extended or adjusted under 35 U.S.C. 154(b) by 93 days.

(21) Appl. No.: 17/361,193

(22) Filed: Jun. 28, 2021

(65) Prior Publication Data
US 2022/0312639 A1     Sep. 29, 2022

(30) Foreign Application Priority Data

Mar. 29, 2021 (CN) .......................... 202110336517.8

(51) Int. Cl.
*H05K 7/20* (2006.01)
*H05K 9/00* (2006.01)

(52) U.S. Cl.
CPC ..... *H05K 7/20309* (2013.01); *H05K 7/20336* (2013.01); *H05K 7/20409* (2013.01); *H05K 9/0007* (2013.01)

(58) Field of Classification Search
CPC ........... H05K 7/20309; H05K 7/20336; H05K 7/20409; H05K 7/2039; H05K 7/20254; H05K 9/0024; H05K 9/0022–0037
See application file for complete search history.

(56) References Cited

U.S. PATENT DOCUMENTS

| | | | | |
|---|---|---|---|---|
| 6,858,796 B1* | 2/2005 | Garnett | ................. | H05K 3/308 |
| | | | | 174/359 |
| 10,104,761 B1* | 10/2018 | MacDonald | ........... | H04R 1/025 |
| 2003/0123227 A1* | 7/2003 | Chin-Wen | ............. | H01L 23/467 |
| | | | | 174/16.3 |
| 2006/0162340 A1* | 7/2006 | Kuo | .......................... | G06F 1/20 |
| | | | | 257/E23.099 |
| 2012/0012281 A1* | 1/2012 | Franz | ........................ | G06F 1/20 |
| | | | | 165/104.21 |

(Continued)

FOREIGN PATENT DOCUMENTS

WO      2020022759 A1     1/2020

OTHER PUBLICATIONS

European Search Report in the European application No. 21182059.2, dated Jan. 5, 2022,(9p).

*Primary Examiner* — Jacob R Crum
*Assistant Examiner* — Matthew Sinclair Muir
(74) *Attorney, Agent, or Firm* — Arch & Lake LLP

(57) ABSTRACT

An electronic device is provided in the present disclosure, and the electronic device includes a middle frame, a heat transfer unit, a shielding case, a heat source and a radiator. The middle frame includes a first surface. The heat transfer unit is disposed on the first surface. The shielding case is spaced apart from the heat transfer unit and is provided with a shielding cavity. The heat source is disposed between the heat transfer unit and the shielding case and includes a circuit board disposed on the heat transfer unit and a first heat source component disposed on the circuit board, the first heat source component is disposed in the shielding cavity. The radiator is configured to dissipate heat from the shielding case and/or the heat source.

18 Claims, 15 Drawing Sheets

(56) References Cited

U.S. PATENT DOCUMENTS

| | | | |
|---|---|---|---|
| 2014/0318167 A1* | 10/2014 | Uchida | G06F 1/20 |
| | | | 62/519 |
| 2018/0020561 A1* | 1/2018 | Ichikizaki | H05K 5/03 |
| 2018/0066897 A1* | 3/2018 | Lin | H05K 7/20336 |
| 2018/0343769 A1* | 11/2018 | Zhou | H05K 7/20418 |
| 2019/0116698 A1* | 4/2019 | Lee | H05K 9/0081 |
| 2019/0274230 A1* | 9/2019 | North | H05K 7/20309 |
| 2020/0029466 A1* | 1/2020 | Long | H05K 7/20309 |
| 2020/0267828 A1 | 8/2020 | Moon et al. | |
| 2020/0281096 A1* | 9/2020 | Shioga | F28D 15/046 |
| 2021/0274637 A1 | 9/2021 | Kim et al. | |

* cited by examiner

ELECTRONIC DEVICE

CROSS-REFERENCE TO RELATED APPLICATION

This application is based upon and claims priority to Chinese Patent Application No. 202110336517.8, filed on Mar. 29, 2021, the entire content of which is incorporated herein by reference for all purposes.

TECHNICAL FIELD

The present disclosure relates to the field of an electronic technology, and particularly to an electronic device.

BACKGROUND

At present, electronic devices, such as mobile phones, tablet computers, wearable devices, distance measuring devices and scanning devices, have become essential technological products in people's life, study and entertainment. With the development of the electronic devices, the number of cores of the Central Processing Unit (CPU) used by the electronic devices has increased, and its performance is being enhanced day by day. As a result, the electronic devices generate more and more heat. Especially in recent years, the temperature rise experience has gradually become an important consideration for consumers when purchasing electronic devices.

However, in related applications of technical solutions of heat dissipation for electronic devices, there is still a problem of local overheating of the electronic devices due to delayed heat dissipation.

SUMMARY

The present disclosure provides an electronic device which has good heat dissipation efficiency and can reduce or avoid the occurrence of local overheating.

According to the examples of the present disclosure, an electronic device is provided, including a middle frame, a heat transfer unit, a shielding case, a heat source and a radiator. The middle frame includes a first surface. The heat transfer unit is disposed on the first surface. The shielding case is spaced apart from the heat transfer unit and is provided with a shielding cavity. The heat source is disposed between the heat transfer unit and the shielding case, and the heat source unit includes a circuit board disposed on the heat transfer unit and a first heat source component disposed on the circuit board. The first heat source component is disposed in the shielding cavity. The radiator is configured to dissipate heat from at least one of the shielding case or the heat source.

It is understood that the above general descriptions and detailed descriptions below are only exemplary and explanatory and not intended to limit the present disclosure.

DETAILED DESCRIPTION

Figure 1:
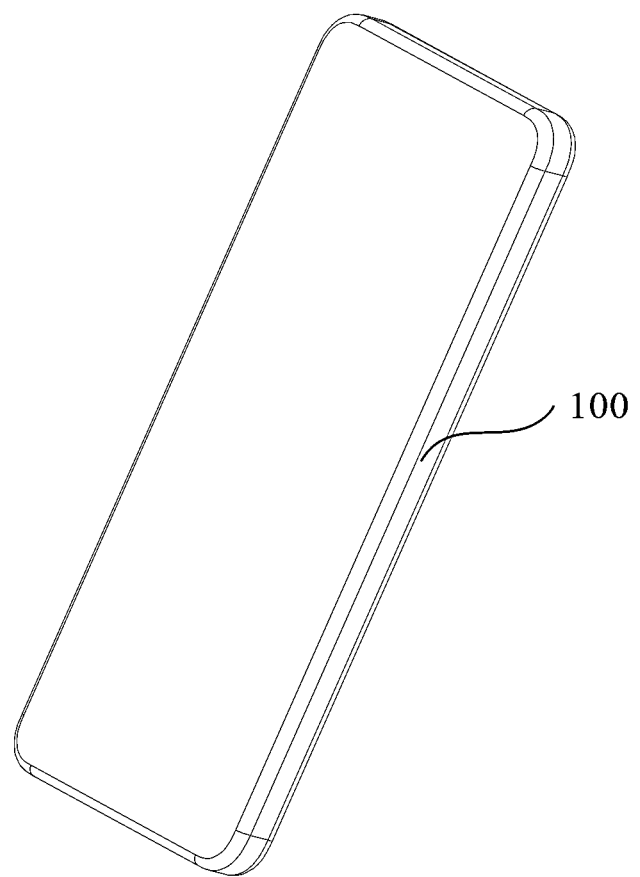
FIG. 1 is a schematic structural view of a mobile terminal shown in one or more examples of the present disclosure.

In order to make the objectives, technical solutions and advantages of the present disclosure more clear, the present disclosure will be further described in detail below with reference to the drawings and specific examples. It is understood that the specific examples described here are only used to explain the present disclosure and do not limit the scope of protection of the present disclosure.

Terms used in the present disclosure are merely for describing specific examples and are not intended to limit the present disclosure. The singular forms "one", "the", and "this" used in the present disclosure and the appended claims are also intended to include a multiple form, unless other meanings are clearly represented in the context. It should also be understood that the term "and/or" used in the present disclosure refers to any or all of possible combinations including one or more associated listed items.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although terms "first", "second", "third", and the like are used in the present disclosure to describe various information, the information is not limited to the terms. These terms are merely used to differentiate information of a same type. For example, without departing from the scope of the present disclosure, first information is also referred to as second information, and similarly the second information is also referred to as the first information. Depending on the context, for example, the term "if" used herein may be explained as "when" or "while", or "in response to . . . , it is determined that".

Unless otherwise defined, all technical and scientific terms used herein have the same meanings as commonly understood by those skilled in the art of the present disclosure. The terms used in the specification of the present disclosure are intended only for the purpose of describing specific examples, and are not intended to limit the present disclosure.

In order to facilitate understanding, the technical terms involved in the examples of the present disclosure will be explained and described below.

A Vapor Chamber (VC) has a vacuum cavity with a fine structure and has a good heat dissipation function, and the materials of the VC include, but are not limited to, copper, stainless steel, titanium alloy, etc.

A heat dissipation fan includes a micro turbine fan, an axial fan, etc.

A Thermal Electric Cooler (TEC) is also called a Peltier cooler.

A Thermal Interface Material (TIM) has good thermal conductivity, and the specific examples of the TIM include, but are not limited to, thermally conductive silicone grease, thermally conductive adhesive, thermally conductive gaskets, etc.

A Loop Heat Pipe (LHP) is an annular heat pipe of a closed loop and has a good heat dissipation function.

A passive heat dissipation structure is a passive heat dissipation component with sheet-shaped heat dissipation teeth.

A resistor-capacitor unit is a general designation of resistor and capacitor type elements.

Reference numerals are described as follows:

100—middle frame; 101—first surface; 102—second surface; 110—cooling part; 120—battery mounting part; 130—loop pipe groove; 140—sealing cover; 150—mounting groove; 160—thermally conductive bonding layer; 200—heat transfer unit; 210—vapor chamber; 220—thermal interface material; 300—shielding case; 310—shielding cavity; 400—heat source unit; 410—circuit board; 420—first heat source component; 430—second heat source component; 500—radiator; 510—passive heat dissipation structure; 511—heat conductor; 512—heat dissipation fin part; 520—thermal electric cooler; 530—heat dissipation fan; 600—protective cover; 610—vent hole; 700—loop heat pipe; 710—evaporator; 711—liquid supplementing end; 712—gas outlet end; 713—evaporation part; 714—liquid storage cavity; 720—pipeline unit; 721—first delivery pipe; 722—second delivery pipe; 723—condensation pipe; 724—liquid supplementing branch; 725—gas outlet branch; 730—anti-backflow structure; 732—Tesla valve structure; 800—working fluid.

At present, electronic devices, such as mobile phones, tablet computers, wearable devices, distance measuring devices and scanning devices, have become essential technological products in people's life, study and entertainment. With the development of the electronic devices, the number of cores of the Central Processing Unit (CPU) used by the electronic devices has increased, and its performance is being enhanced day by day. As a result, the electronic devices generate more and more heat, which poses higher and higher challenges to the heat dissipation performance of the electronic devices. Especially in recent years, the temperature rise experience has gradually become an important consideration for consumers when purchasing electronic devices. Furthermore, the better the heat dissipation performance, the more balanced the heat dissipation, the more attractive to consumers to purchase the electronic devices. Therefore, improving the heat dissipation efficiency of electronic devices and avoiding local overheating have become an increasingly important issue in the industry.

However, in related applications of technical solutions of heat dissipation for electronic devices, it is easy to cause the phenomenon of delayed heat dissipation, and the heat dissipation efficiency is difficult to improve. The delayed heat dissipation will cause local overheating of the electronic devices, which easily affects the operating performance of the electronic devices, and even causes crash.

Based on this, the present disclosure provides an electronic device which can improve the heat dissipation efficiency and avoid local overheating, thereby ensuring the operating performance of the electronic device, and being favorable for improving the reliability of the electronic device.

The technical solutions of the present disclosure will be further described below in conjunction with the specific structural views.

Figure 2:
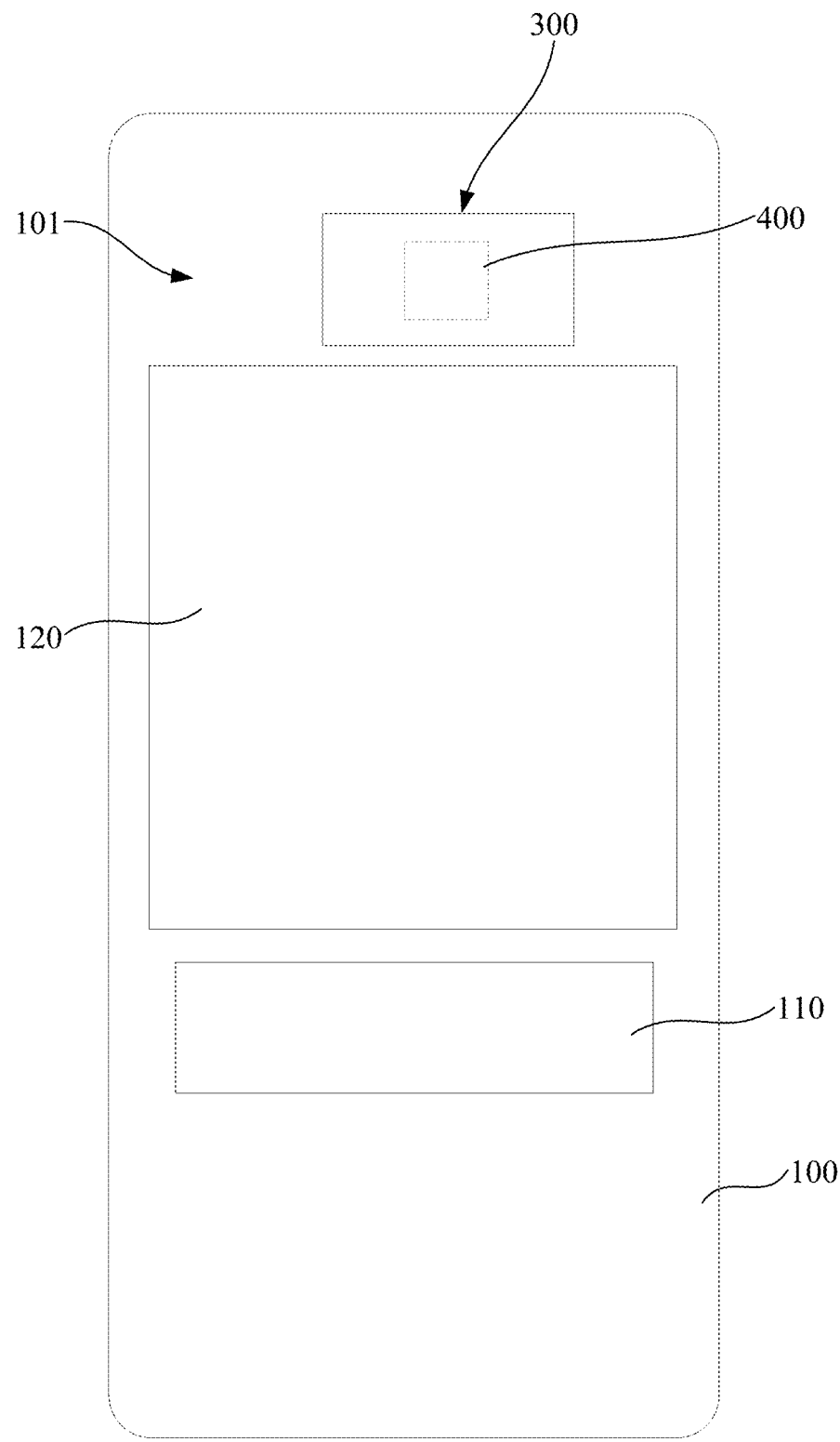
FIG. 2 is a schematic structural front view of a middle frame shown in FIG. 1.
Figure 3:
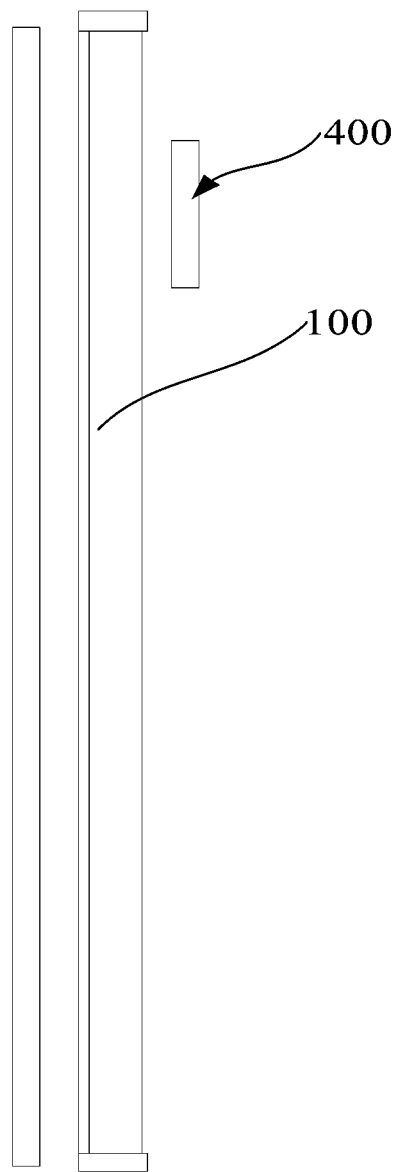
FIG. 3 is a schematic structural explosive view of a part of the mobile terminal shown in FIG. 1.
Figure 4:
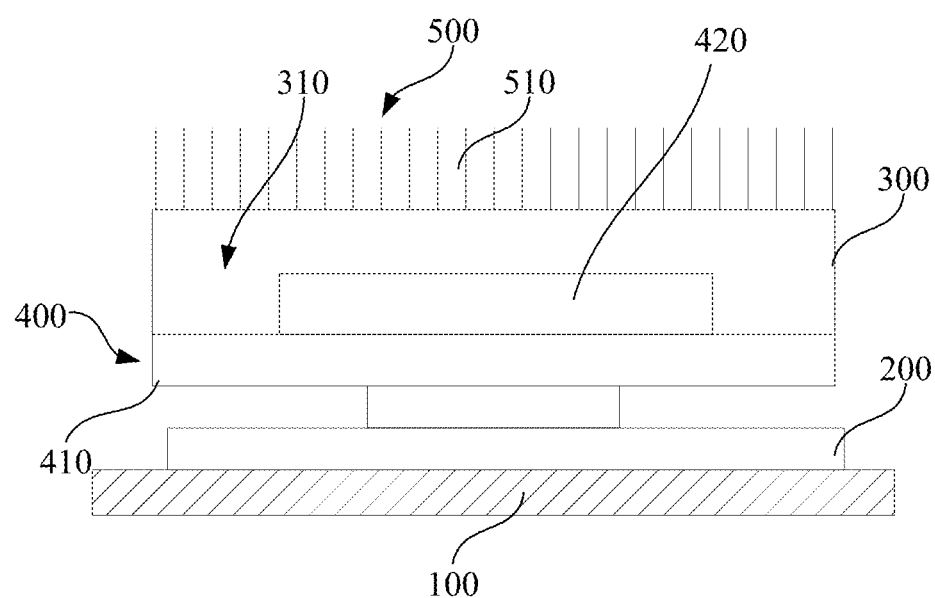
FIG. 4 is a schematic side view of a shielding assembly in an electronic device shown in FIG. 3.

FIG. 1 to FIG. 4 are schematic views of an electronic device and the structure of the electronic device shown in an example. Specifically, FIG. 1 is a schematic structural view of a mobile terminal shown in an example. FIG. 2 is a schematic structural front view of a middle frame shown in FIG. 1. FIG. 3 is a schematic structural explosive view of a part of the mobile terminal shown in FIG. 1. FIG. 4 is a schematic side view of a shielding assembly in an electronic device shown in FIG. 3.

The examples of the present disclosure provide an electronic device which may be a mobile phone, a tablet computer, an e-reader, a notebook computer, an on-board device, a wearable device, a distance measuring device, a scanning device, etc. The electronic device includes a middle frame 100, a shielding case 300, a heat source unit 400 and a radiator 500.

The middle frame 100 includes a first surface 101. A heat transfer unit 200 is disposed on the first surface 101. The shielding case 300 is spaced apart from the heat transfer unit 200 and is provided with a shielding cavity 310. The heat source unit 400 is disposed between the first surface 101 and the shielding case 300, the heat source unit 400 includes a circuit board 410 disposed on the heat transfer unit 200 and a first heat source component 420 disposed on the circuit board 410, and the first heat source component 420 is disposed in the shielding cavity 310. The radiator 500 is configured to dissipate heat from at least one of the shielding case 300 or the heat source unit 400.

When the electronic device of the present disclosure is used, the first heat source component 420 is fixedly disposed in the shielding cavity 310, and the radiator 500 is configured to improve the heat dissipation efficiency of the shielding case 300, so that the electronic device of the present disclosure has a better shielding effect, and the heat dissipation efficiency can also be ensured, thereby avoiding the occurrence of local overheating of the first heat source component 420 disposed in the shielding cavity 310, and being favorable for improving the operating stability and reliability. In addition, the heat source unit 400 is disposed on the middle frame 100 through the heat transfer unit 200. In this way, not only the heat transfer unit 200 can be used to quickly dissipate heat, but also the area of the middle frame 100 can be fully utilized for heat dissipation, thereby further improving the heat dissipation efficiency.

In the examples of the present disclosure, the middle frame 100 may be a frame structure of the electronic device, and in addition to the heat source unit 400 that can be integrated, other parts or all components of the electronic device may be directly or indirectly disposed on the middle frame 100 to be assembled into the electronic device.

Optionally, the middle frame 100 may be disposed inside the electronic device. An edge of the middle frame 100 may be designed as a part of a housing of the electronic device. When the edge of the middle frame 100 serves as the housing of the electronic device, it can protect the electronic device.

Optionally, the middle frame 100 may have a plane structure or a structure similar to a plane. Therefore, two side surfaces of the middle frame 100 can be distinguished visually. The two side surfaces may be called a front surface and a rear surface of the middle frame 100, or the two side surfaces may also be called one side and another side of the middle frame 100. The inside of the middle frame 100 may be partially hollowed out according to needs to facilitate arranging other components in the electronic device.

Optionally, a part or the entire middle frame 100 may be made of a metal or an alloy material (such as aluminum alloy). The middle frame 100 may also be made of other materials which are not specifically limited in the examples of the present disclosure.

It is noted that the heat transfer unit 200 includes a Vapor Chamber (VC) 210, a heat pipe, graphene, etc.

On the basis of any one of the above examples, in an example, the heat transfer unit 200 further includes a vapor chamber 210 with a phase change working medium. Therefore, the phase change working medium can be selected according to actual needs to meet the heat dissipation needs of different electronic devices, thereby obtaining better cost performance.

On the basis of any one of the above examples, in an example, the boiling point of the phase change working medium is 20° C. to 90° C. In this case, when the working temperature of the electronic device is 10° C. to 45° C., the heat transfer unit 200 has good thermal conductivity and heat dissipation performance. Therefore, the heat generated by the heat source unit 400 can be dissipated and conducted through the heat transfer unit 200 in time, so as to avoid local overheating of the electronic device.

The phase change working medium includes, but is not limited to, formaldehyde, methanol, ethanol or a mixture thereof with pure water.

In addition, a starting temperature of the heat transfer unit 200 can be adjusted according to needs. For example, by adjusting a vacuum degree in a cavity of the heat transfer unit 200 and/or using phase change working media with different boiling points to reduce the starting temperature of the heat transfer unit 200, a balanced state of a full phase change between gas and liquid is achieved in advance.

Figure 5:
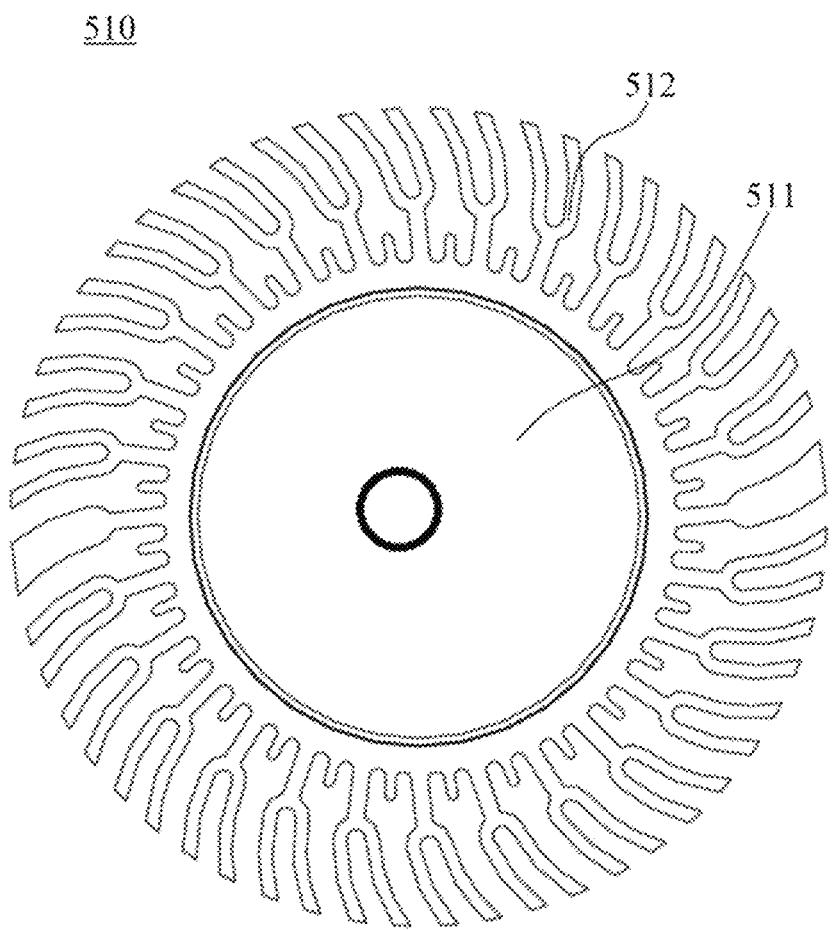
FIG. 5 is a schematic top view of a passive heat dissipation structure shown in FIG. 4.
Figure 6:
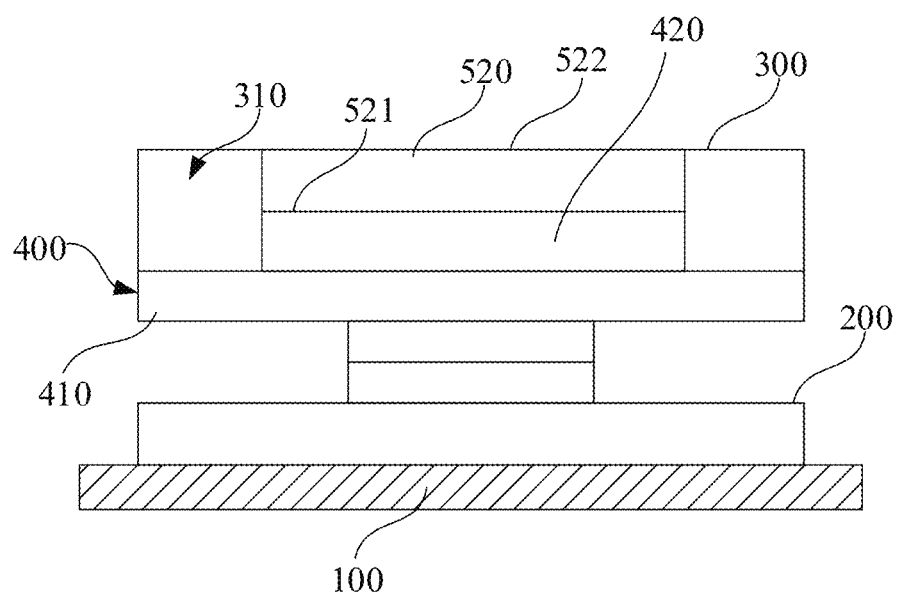
FIG. 6 is a schematic side view of a shielding assembly in an electronic device shown in another example.
Figure 7:
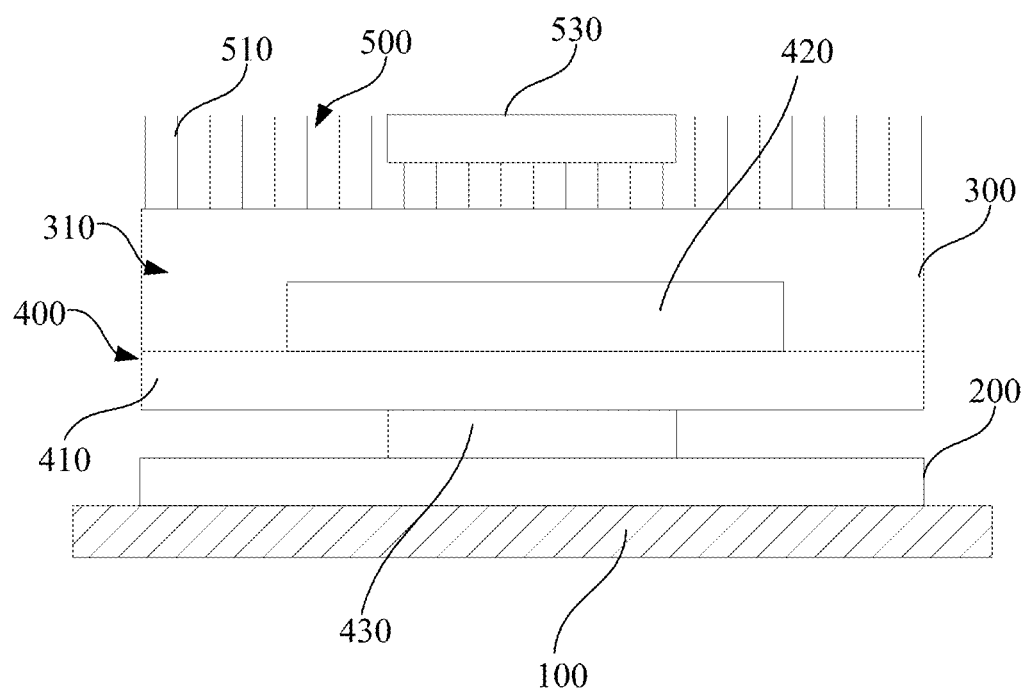
FIG. 7 is a partial schematic cross-sectional view of a shielding assembly in an electronic device as shown in another example.
Figure 8:
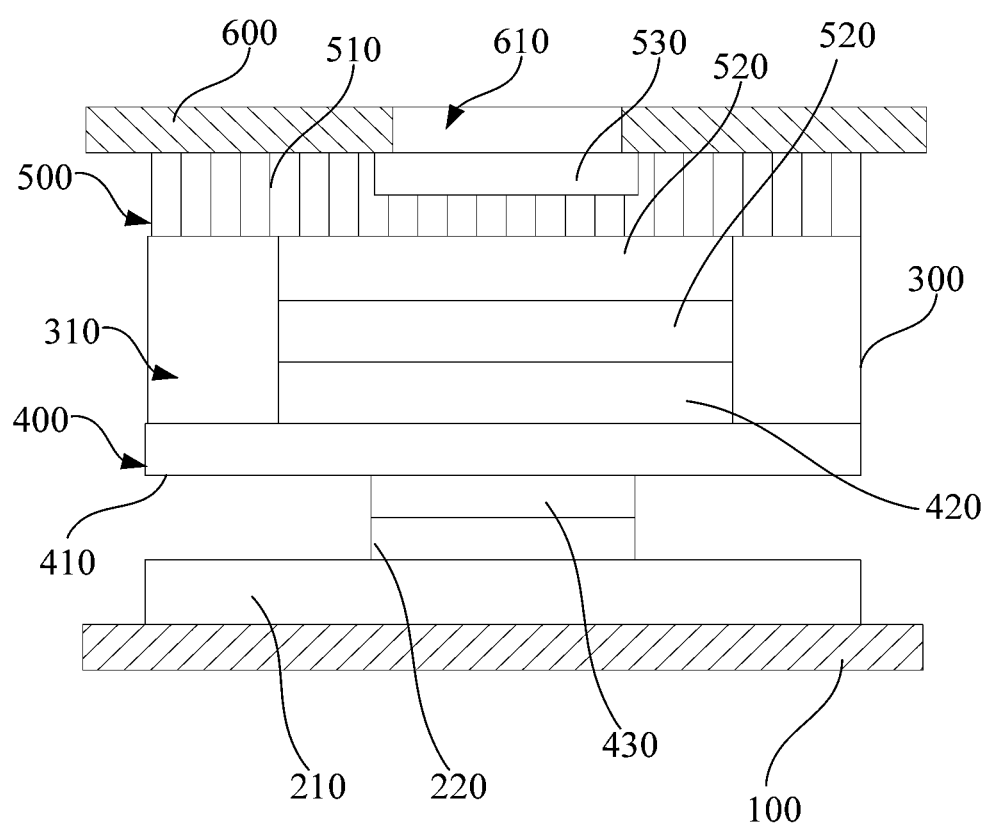
FIG. 8 is a partial schematic cross-sectional view of a shielding assembly in an electronic device as shown in another example.

FIG. 5 to FIG. 8 are schematic structural views of a shielding assembly in an electronic device in some examples. Specifically, FIG. 4 is a schematic side view of a shielding assembly in an electronic device shown in FIG. 3. FIG. 5 is a schematic top view of a passive heat dissipation structure shown in FIG. 4. FIG. 6 is a schematic side view of a shielding assembly in an electronic device in another example. FIG. 7 is a partial schematic cross-sectional view of a shielding assembly in an electronic device in another example. FIG. 8 is a partial schematic cross-sectional view of a shielding assembly in an electronic device in another example.

There may be many specific implementation manners of the radiator 500.

In addition, the radiator 500 includes a passive heat dissipation structure 510 disposed on an outer side of the shielding case 300. Therefore, the heat dissipation area of the shielding case 300 can be increased by means of the passive heat dissipation structure 510, so as to improve the heat dissipation efficiency of the shielding case 300.

In some examples, the passive heat dissipation structure 510 includes a heat conductor 511 and heat dissipation fin part 512. The heat dissipation fin part 512 surrounds and covers an outer surface of the heat conductor 511. The heat generated by the heat source unit 400 is transferred to the heat dissipation fin part 512 by the heat conductor 511 and is further transferred into the outside air by the heat dissipation fin part 512, thereby enhancing the heat dissipation effect. For example, the heat conductor 511 and the heat dissipation fin part 512 are respectively provided as separate components. Further, for example, the passive heat dissipation structure 510 is integrally molded by casting to enhance the mechanical performance.

The material of the passive heat dissipation structure 510 is aluminum alloy. For example, the specific surface area of the heat dissipation fin part 512 is 4 to 10 times the specific surface area of the heat conductor 511. For example, the specific surface area of the heat dissipation fin part 512 is 6.8 times the specific surface area of the heat conductor 511.

When a heat dissipation fan 530 is combined with the passive heat dissipation structure 510, the heat dissipation fan 530 is disposed outside the heat conductor 511. The heat dissipation fin part 512 includes multiple fins. A heat dissipation flow channel is formed between two adjacent fins, and is configured to guide the gas flow generated by the heat dissipation fan 530, which is favorable for improving the heat dissipation efficiency.

The radiator 500 may also be provided with an active heat dissipation component, so as to actively dissipate heat from at least one of the shielding case 300 or the heat source unit 400.

For example, in an example, the radiator 500 includes a thermal electric cooler 520. A heat absorption part 521 of the thermal electric cooler 520 cooperates with the first heat source component 420 in a mode of heat conduction, and a heat release part 522 of the thermal electric cooler cooperates with the shielding case 300 in a mode of heat conduction. In this way, the thermal electric cooler 520 is used as an active heat dissipation component. Herein, the heat absorption part 521 actively absorbs the heat transferred from the first heat source component 420, and actively transfers the heat energy to the shielding case 300 for heat dissipation, thereby reducing the temperature inside the shielding cavity 310, avoiding the overheating phenomenon at the shielding case 300, and further improving the reliability of the electronic device.

Alternatively, in another example, the radiator 500 includes a heat dissipation fan 530. The heat dissipation fan 530 is disposed toward the shielding case 300. In this way, the heat dissipation fan 530 can be used to generate turbulent gas flow, so as to further realize uniform heat dissipation of the shielding case 300, and avoid the overheating phenomenon at the shielding case 300. In addition, when interacting with the external gas, the external cold gas is introduced into the electronic device to reduce the temperature of the electronic device, thereby further improving the heat dissipation efficiency of the electronic device.

The heat dissipation fan 530 may be disposed in the electronic device or may be detachably disposed in the electronic device, which is not limited too much here.

Alternatively, in another example, the radiator 500 includes a heat dissipation fan 530 and a thermal electric cooler 520. A heat absorption part 521 of the thermal electric cooler 520 cooperates with the first heat source component 420 in a mode of heat conduction, and a heat release part of the thermal electric cooler cooperates with the shielding case 300 in a mode of heat conduction. The heat dissipation fan 530 is disposed toward the shielding case 300. In this way, the heat dissipation fan 530 can be used to actively supply air to the shielding case 300 or form a negative pressure, so as to increase the flow rate of air outside the shielding case 300, to accelerate the heat dissipation; and also accelerate absorption of the heat from the first heat source component 420 by the heat absorption part 521, thereby further reducing the temperature in the shielding cavity 310, and avoiding the overheating phenomenon at the shielding case 300.

In addition, the radiator 500 may not only be provided with an active heat dissipation component, but also be integrated with a passive heat dissipation structure 510.

For example, in an example, the radiator 500 includes a heat dissipation fan 530 and a passive heat dissipation structure 510. The passive heat dissipation structure 510 is fixedly disposed on the shielding case 300, and the heat dissipation fan 530 is disposed on the passive heat dissipation structure 510. In this way, the passive heat dissipation structure 510 can be used to absorb the heat of the shielding case 300, so as to accelerate the heat dissipation of the shielding case 300. Furthermore, the heat dissipation fan 530 can be used to generate turbulent gas flow to improve the heat dissipation efficiency of the passive heat dissipation structure 510, and thus the electronic device has high heat dissipation efficiency and uniform heat dissipation.

Alternatively, in another example, the radiator 500 includes a passive heat dissipation structure 510 and a thermal electric cooler 520. A heat absorption part 521 of the thermal electric cooler 520 cooperates with the first heat source component 420 in a mode of heat conduction, a heat release part 522 of the thermal electric cooler cooperates with the shielding case 300 in a mode of heat conduction, and the passive heat dissipation structure 510 is disposed on the outer side of the shielding case 300. In this way, the thermal electric cooler 520 is used as an active heat dissipation component. Herein, the heat absorption part of the thermal electric cooler actively absorbs the heat transferred from the first heat source component 420, and actively transfers the heat energy to the shielding case 300 for heat dissipation, so that the heat dissipation efficiency can be improved. Furthermore, the heat dissipation efficiency of the shielding case 300 can be improved by means of the passive heat dissipation structure 510, thereby further accelerating the heat dissipation of the heat source unit 400, and avoiding the overheating phenomenon at the shielding case 300.

Alternatively, in another example, the radiator 500 includes a passive heat dissipation structure 510, a heat dissipation fan 530 and a thermal electric cooler 520. A heat absorption part 521 of the thermal electric cooler 520 cooperates with the first heat source component 420 in a mode of heat conduction, a heat release part 522 of the thermal electric cooler cooperates with the shielding case 300 in a mode of heat conduction, the passive heat dissipation structure 510 is disposed on the outer side of the shielding case 300, and the heat dissipation fan 530 is disposed on the passive heat dissipation structure 510. In this way, the thermal electric cooler 520 is used as an active heat dissipation component. Herein, the heat absorption part of the thermal electric cooler actively absorbs the heat transferred from the first heat source component 420, so that the first heat source component 420 can be cooled. Further, the passive heat dissipation structure 510 is used to absorb the heat transferred from the heat release part 522 to the shielding case 300, so as to accelerate the heat dissipation efficiency of the shielding case 300. Furthermore, the heat dissipation fan 530 can be used to generate turbulent gas flow to improve the heat dissipation efficiency of the passive heat dissipation structure 510, so that the electronic device has high heat dissipation efficiency and uniform heat dissipation, and the overheating phenomenon at the shielding case 300 can be avoided.

The heat dissipation fan 530 or the heat dissipation fan 530 and the passive heat dissipation structure 510 may be detachably disposed in the electronic device.

In some examples, the electronic device further includes a protective cover 600 cooperating with the middle frame 100 to form a protective space, and at least a part of the radiator 500 is detachably connected with the protective cover 600. In this way, when the radiator 500 includes the heat dissipation fan 530, the heat dissipation fan 530 may be detachably disposed on the protective cover 600.

In some examples, when the electronic device is a mobile terminal, the protective cover 600 is a rear cover.

On the basis of any one of the above examples of the protective cover 600, in an example, the protective cover 600 is provided with a vent hole 610 communicating with the protective space. In this way, when the electronic device is capable of meeting the heat dissipation requirement by means of the thermal electric cooler 520, the heat dissipation fan 530 can be dismounted. When the thermal electric cooler 520 cannot meet the heat dissipation requirement, the heat dissipation fan 530 can be connected to an external power supply and mounted in the electronic device, so that the external gas can be delivered into the electronic device through the vent hole 610 so as to improve the heat dissipation efficiency of the electronic device.

Optionally, the electronic device is a smart television. In any one of the above examples of the heat dissipation fan 530, the heat dissipation fan 530 is detachably disposed on the rear cover. In this case, the heat dissipation fan 530 may be selectively mounted according to models of smart televisions corresponding to specifications of different central processing units, so as to reduce the production cost and avoid the waste of the heat dissipation performance.

Optionally, the protective cover 600 is provided with a waterproof and gas-permeable membrane (not shown), and the waterproof and gas-permeable membrane covers the vent hole 610. In this way, the waterproof and gas-permeable membrane can ensure the heat exchange efficiency and improve the waterproof performance and/or dustproof performance of the electronic device.

In some examples, the vent hole 610 includes a gas inlet hole and a gas outlet hole. In this case, the heat dissipation fan 530 cooperates with the gas inlet hole and the gas outlet hole, so that a directional gas flow can be formed in the protective space to further improve the heat dissipation efficiency.

In order to further improve the heat dissipation efficiency of the shielding case 300, in some examples, the heat dissipation device further includes a heat dissipation layer (not shown), and the heat dissipation layer is disposed on outer side walls of the shielding case 300 and of the heat transfer unit 200.

The heat dissipation layer includes, but is not limited to, a graphene coating.

In the examples of the present disclosure, the heat source unit 400 refers to a means that radiates more heat in an electronic device, and includes at least one heat source component, i.e., a heating element.

In an example, the heat source unit 400 further includes a second heat source component 430, the second heat source component 430 is disposed on an opposite surface of the circuit board 410 relative to the first heat source component 420, and the second heat source component 430 cooperates with the heat transfer unit 200 in a mode of heat conduction. In this case, the heat transfer unit 200 can be used to dissipate heat from the second heat source component 430 so as to fully dissipate heat from the heat source unit 400, thereby avoiding local overheating of the electronic device due to delayed heat dissipation of the heat source unit 400.

In practical application processes, the heat radiated by the components is usually positively correlated with the power consumption of the components. The greater the power consumption of the components, the more the heat radiated by the components. Correspondingly, the heat source component in the present disclosure may be a means in the electronic device whose power consumption exceeds M % of the overall power consumption of the electronic device, and M may be 20, 30, 40, etc.

Optionally, the heat source component may include a central processing unit, a processing unit integrating processing and storage functions, a power supply component (such as a battery), etc.

In an example, the first heat source component 420 is a resistor-capacitor unit, the second heat source component 430 is a Central Processing Unit (CPU), and the resistor-capacitor unit and the CPU are respectively disposed on two surfaces of the circuit board 410. The resistor-capacitor unit is disposed in the shielding cavity 310 and cooperates with the shielding case 300 in a mode of heat conduction, and the CPU cooperates with the middle frame 100 in a mode of heat conduction.

In some examples, the heat dissipation device includes a heat transfer unit 200, and the heat transfer unit 200 cooperates with the second heat source component 430 in a mode of heat conduction. In this case, the heat dissipation efficiency and heat conduction efficiency of the middle frame 100 can be improved by means of the heat transfer unit 200, so as to facilitate the heat dissipation of the second heat source component 430, thereby avoiding the overheating phenomenon of the heat source unit 400.

Optionally, the central processing unit is fixedly disposed on the heat transfer unit 200 via a thermal interface material 220. The thermal interface material 220 may be disposed between the central processing unit and the heat transfer unit 200 in a variety of ways, such as pasting, painting and spraying, or the formed thermal interface material 220 is fixedly and connectedly clamped between the central processing unit and the heat transfer unit 200.

In an example, the thermal interface material 220 has elasticity and is squeezed between the central processing unit and the heat transfer unit 200. In this way, the thermal interface material 220 can fully fill a gap between the central processing unit and the heat transfer unit 200, thereby increasing the contact area, and improving the heat dissipation efficiency of the thermally conductive central processing unit. In addition, the thermal interface material 220 having elasticity can achieve a buffering effect so as to protect the central processing unit.

In some examples, the thermal interface material 220 is one of thermally conductive colloids, such as thermally conductive silicone and thermally conductive rubber.

Similarly, the resistor-capacitor unit may also cooperate with the middle frame 100 in a mode of heat conduction through the thermal interface material 220. Therefore, the middle frame 100 can be fully utilized to perform heat dissipation.

The heat source component may also be other components which are not specifically limited in the examples of the present disclosure.

In addition, in some examples, a thermal interface material 220 having elasticity may also be disposed between the above-mentioned separate adjacent components so as to improve the heat conduction effect between the adjacent components, and the heat dissipation efficiency is increased by means of the thermal interface material 220.

The above-mentioned thermal interface material 220 may be disposed between the middle frame 100 and the second heat source component 430, and/or between the thermal electric cooler 520 and the first heat source component 420, and/or between the shielding case 300 and the first heat source component 420.

In order to further improve the heat dissipation efficiency and heat dissipation effect of the electronic device, the heat dissipation efficiency of the middle frame 100 may also be further improved, so that the components directly or indirectly disposed on the middle frame 100 have a good heat dissipation environment.

Figure 9:
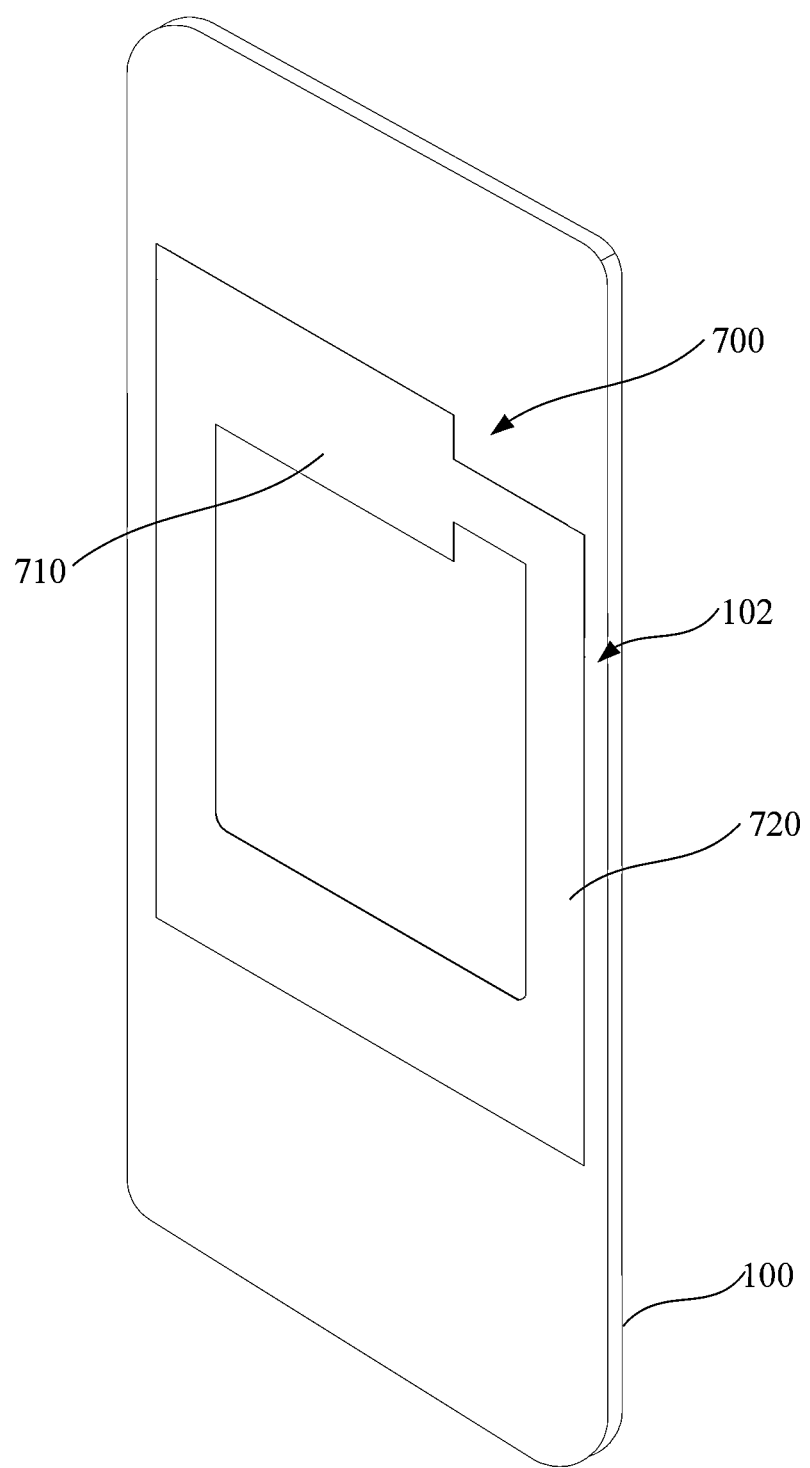
FIG. 9 is a schematic structural rear view of a heat dissipation component of a middle frame shown in FIG. 3.
Figure 10:
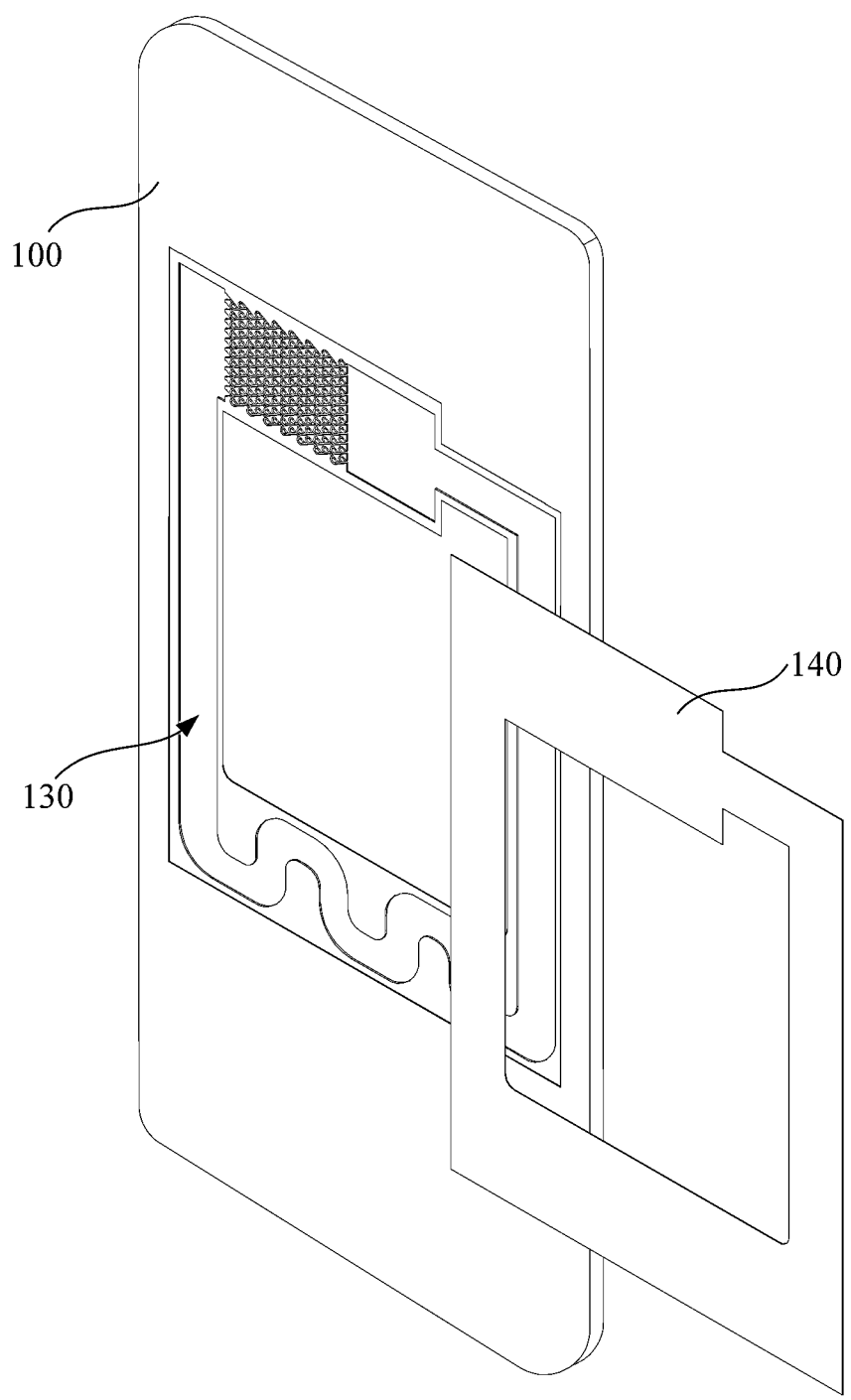
FIG. 10 is a schematic structural explosive view of the heat dissipation component of the middle frame shown in FIG. 9.
Figure 11:
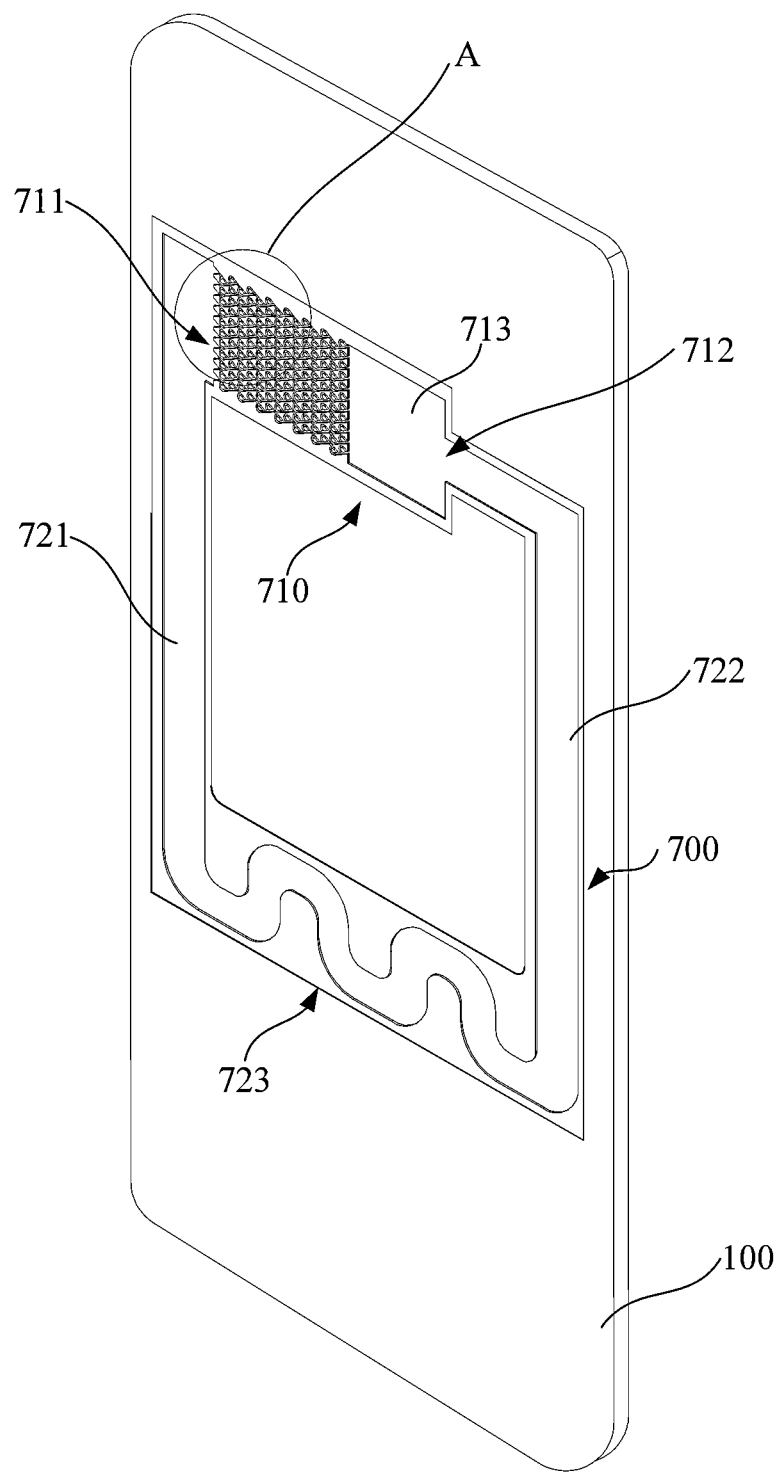
FIG. 11 is a schematic structural view of a part of the heat dissipation component of the middle frame shown in FIG. 10.
Figure 12:
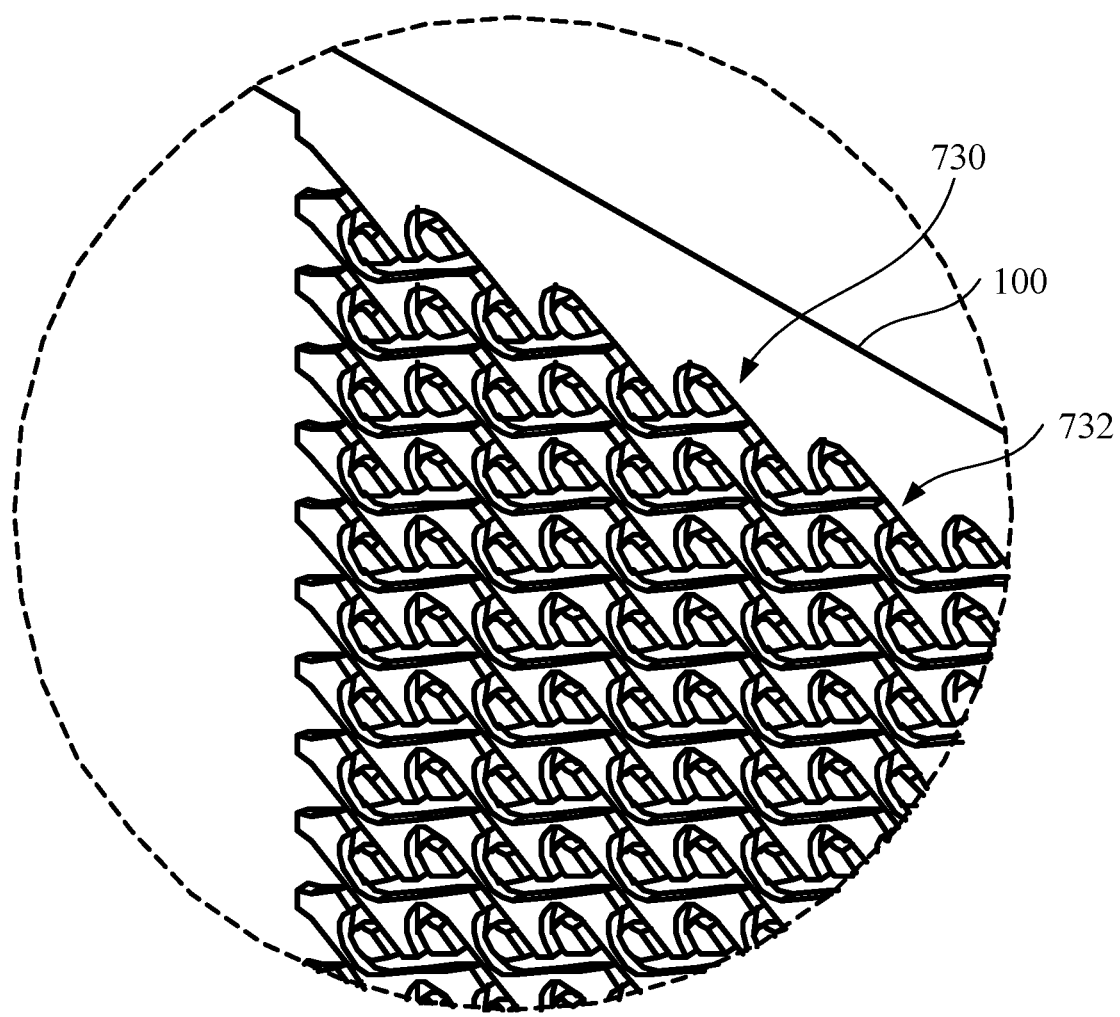
FIG. 12 is a schematic enlarged view of a part A shown in FIG. 11.
Figure 13:
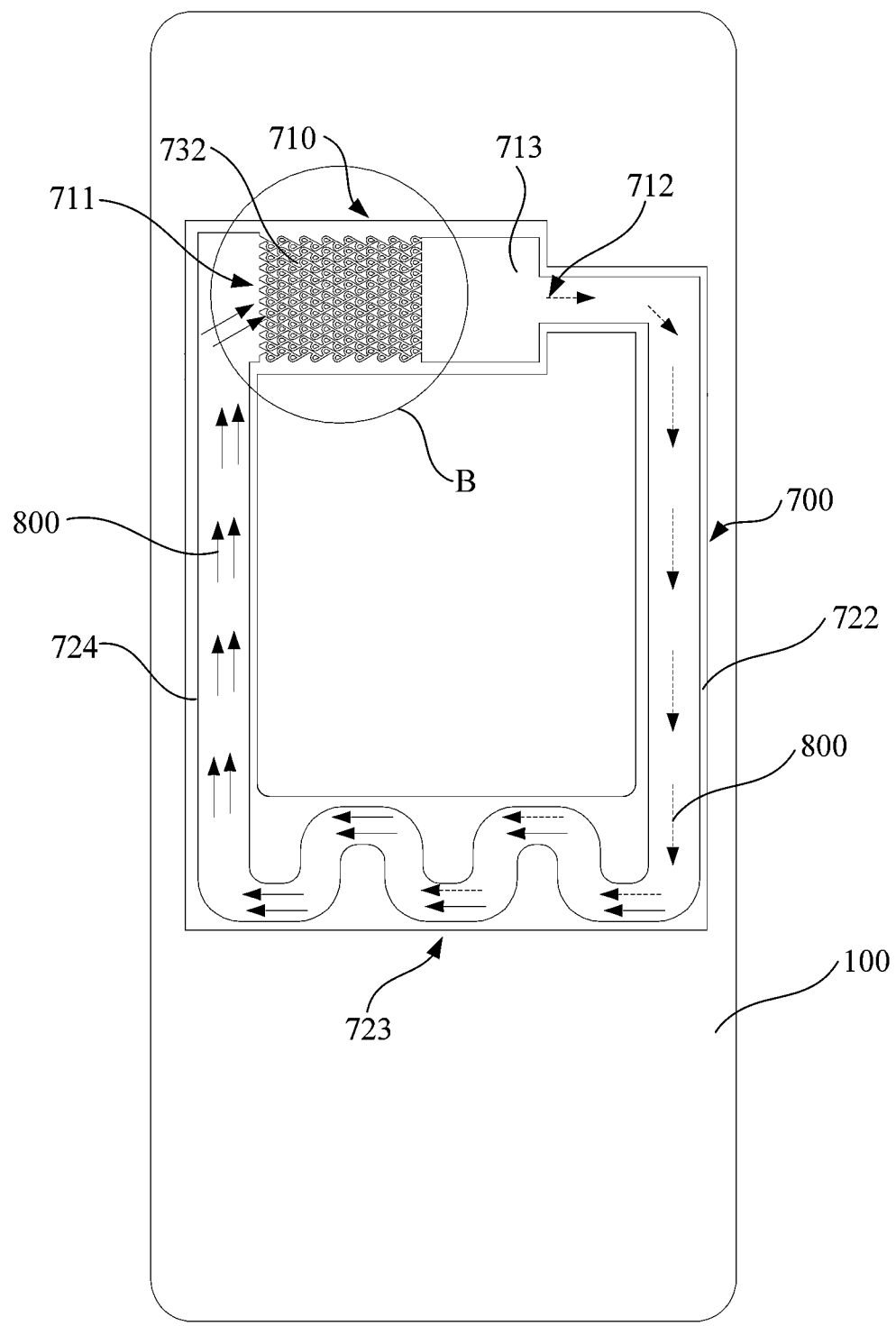
FIG. 13 is a schematic view of a heat dissipation state of the heat dissipation component of the middle frame shown in FIG. 11.
Figure 14:
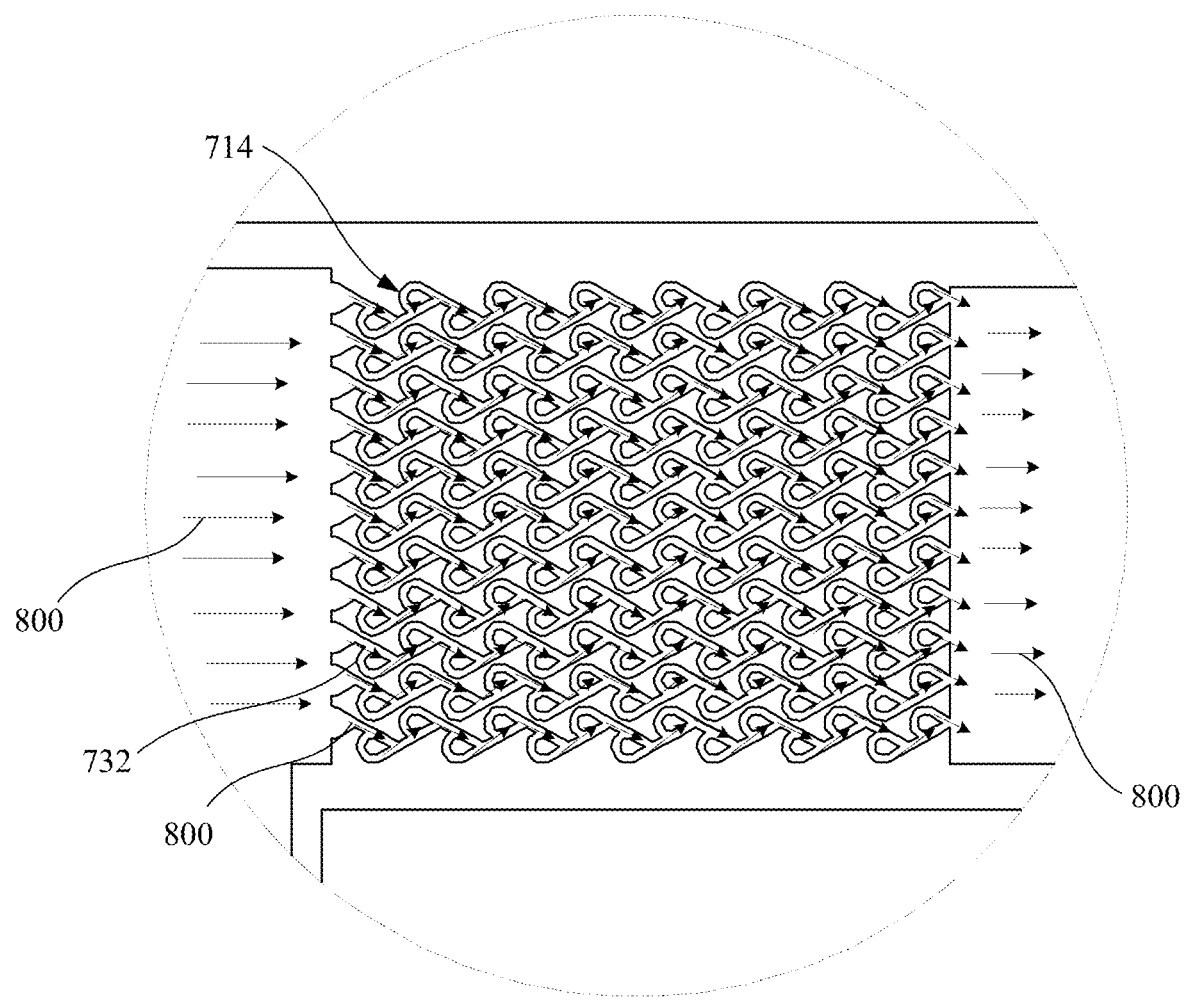
FIG. 14 is a schematic enlarged view of a part B shown in FIG. 13.

FIG. 9 to FIG. 14 are schematic structural views of a heat dissipation component of a middle frame in some examples. Specifically, FIG. 9 is a schematic structural rear view of the heat dissipation component of the middle frame shown in FIG. 2. FIG. 10 is a schematic explosive view of the heat dissipation component of the middle frame shown in FIG. 9. FIG. 11 is a structural schematic view of a part of the heat dissipation component of the middle frame shown in FIG. 10. FIG. 12 is a schematic enlarged view of a part A shown in FIG. 11. FIG. 13 is a schematic view of a heat dissipation state of a heat dissipation component of a middle frame shown in FIG. 11. FIG. 14 is a schematic enlarged view of a part B shown in FIG. 13.

In some examples, the middle frame 100 further includes a cooling part 110 and a second surface 102 disposed opposite to the first surface 101, and the electronic device further includes a loop heat pipe 700 and a working fluid 800. The loop heat pipe 700 is disposed on the second surface 102. The loop heat pipe 700 includes an evaporator 710 and a pipeline unit 720. The evaporator 710 is disposed opposite to the second heat source component 430. The evaporator 710 includes a liquid supplementing end 711 and a gas outlet end 712. One end of the pipeline unit 720 is communicated with the liquid supplementing end 711, and another end of the pipeline unit 720 is communicated with the gas outlet end 712. A part of the pipeline unit 720 cooperates with the cooling part 110 in a mode of heat conduction. The working fluid 800 is filled in the loop heat pipe 700. The working fluid 800 in a liquid state can be converted into the working fluid 800 in a gas state by the evaporator 710, and the working fluid 800 in a gas state can flow into the pipeline unit 720 through the gas outlet end 712. The working fluid 800 in a gas state can be re-liquefied in the pipeline unit 720 and delivered into the liquid supplementing end 711.

In this case, the loop heat pipe 700 is integrated on the middle frame 100, the evaporator 710 is used to absorb the heat of the second heat source component 430 to actively dissipate heat from the heat source unit 400, and then, the pipeline unit 720 is used to transfer the heat to the cooling part 110. In this way, the space of the middle frame 100 can be fully utilized for heat dissipation, and thus the heat dissipation performance of the middle frame 100 can be improved, and the heat dissipation efficiency of the components integrated on the middle frame 100, especially the heat source unit 400 which is easy to generate heat, can be improved.

In some examples, the first surface 101 is a front surface of the middle frame 100, and the second surface 102 is a rear surface of the middle frame 100.

It needs to be noted that the "cooling part 110" generally refers to a position where its temperature rise is slower than the temperature rise of the heat source unit 400, that is, a position where the internal temperature of the electronic device is lower than the temperature of the "heat source unit 400" during the use of the electronic device.

Optionally, a rear region corresponding to a battery compartment and a small plate region far away from the "heat source unit 400" can be provided as the cooling part 110 to accelerate the liquefaction of the working fluid 800.

It needs to be noted that the "working fluid 800" includes, but is not limited to, cooling liquid (such as water) and other fluids that can be applied to the loop heat pipe 700, and the boiling point of the "working fluid 800" can be adjusted according to actual needs, which is not limited here.

For example, the working fluid 800 includes, but is not limited to, formaldehyde, methanol, ethanol or a mixture thereof with pure water.

It needs to be noted that the "evaporator 710" includes structures such as capillary cores, and the specific structure of the "evaporator 710" includes, but is not limited to, other structures of the evaporator 710 that can be applied to the loop heat pipe 700.

In some examples, when the electronic device of the present disclosure is used, the heat source unit 400 generates heat due to operation, and the evaporator 710 can actively absorb the heat transferred from the heat source unit 400 through the middle frame 100. In this case, the working fluid 800 in a liquid state in the evaporator 710 evaporates due to absorption of the heat, consumes heat energy, and flows to the cooling part 110 through the pipeline unit 720 due to volume expansion. During this process, the working fluid 800 in a gas state will transfer the heat to the middle frame 100 and can be condensed into a liquid by releasing a large amount of heat when flowing through the cooling part 110. The liquefied working fluid 800 will be driven by the capillary force of the capillary core in the evaporator 710 to flow back to the liquid supplementing end 711. The liquid in a compensation cavity then will be evaporated by the evaporator 710 again to continue to absorb heat. In this way, an evaporation-condensation cycle is formed. The circulation of the working fluid 800 is driven by the capillary pressure generated by the capillary core of the evaporator 710, and the working fluid 800 has a regular flow direction and a high flow rate, which can accelerate the heat dissipation. Therefore, the middle frame 100 can be used to actively reduce the temperature of the heat source unit 400, the heat can be remotely transported and dissipated to the cooling part 110, such as a battery compartment and a small plate, and the size of the middle frame 100 is fully utilized for heat dissipation, so as to greatly improve the heat dissipation efficiency of the electronic device.

The components of the middle frame 100 of the present disclosure realize the improvement of core capabilities of large heat transfer capacity and long heat transfer distance without increasing the stacking thickness of the traditional middle frame 100 and the whole machine, and combines the distribution of a heat source part and that of a non-heat source part (that is, the cooling part 110), to make full use of the area of the whole middle frame 100 to achieve high-efficiency heat dissipation.

In some examples, at least a part of the loop heat pipe 700 is embedded in the middle frame 100, to make full use of the thickness space of the middle frame 100 to integrate the loop heat pipe 700, so that the contact area can be increased to improve the heat dissipation efficiency, and the size of the protruding thickness of the heat dissipation structure can be actively reduced. In this way, the components of the middle frame 100 of the present disclosure can meet the needs of the electronic device for the thin and light design, so that the electronic device of the present disclosure can be designed to be lighter and thinner and has good heat dissipation performance, which can improve the product competitiveness.

As shown in FIG. 4, in some examples, the middle frame 100 and the cooling part 110 are disposed on two sides of a battery mounting part 120 at intervals. In this way, the middle frame 100 and the cooling part 110 can be separated from each other to fully dissipate heat. Furthermore, when the flow passes through the battery mounting part 120, the heat of the battery mounting part 120 can be dissipated.

For example, in the electronic device of the present disclosure, the central processing unit as the heat source unit 400 can be integrated on a main board, the main board is disposed at one end of a battery, and a small plate or a charging panel is disposed at an another end of the battery. When the battery is not charged, and the central processing unit generates heat when the electronic device is used, the loop heat pipe 700 is used to dissipate heat. Moreover, since the heat flows through the battery and the charging panel, the heat dissipation layer of the battery and a part of the heat dissipation layer of the charging panel can be used to accelerate heat dissipation, so as to further improve the heat dissipation efficiency. When the battery is charged, the loop heat pipe 700 can also be used to dissipate heat.

As shown in FIG. 2 and FIG. 9, in some examples, in a projection plane of the middle frame 100 in a front-view direction, at least a part of the evaporator 710 is overlapped with at least a part of the middle frame 100. In this way, a heat source component is mounted on the second heat source component 430. When the electronic device is used, the heat from the heat source component can be dissipated by means of the middle frame 100, and the heat can be transferred to the evaporator 710 only by passing through a distance of the thickness size of the middle frame 100, to improve the heat absorption efficiency of the evaporator 710. As such, the working fluid 800 is heated and then vaporized to quickly dissipate the heat from the heat source component, thereby further improving the heat dissipation efficiency.

On the basis of any one of the above examples, as shown in FIG. 10 to FIG. 11, in some examples, the middle frame 100 is provided with a loop pipe groove 130, and the components of the middle frame 100 further include a sealing cover 140 covering the loop pipe groove 130 and forming at least a part of the loop heat pipe 700. In this case, by directly forming the loop pipe groove 130 in the middle frame 100 and covering the loop pipe groove 130 with the sealing cover 140, the thickness size of the middle frame 100 can be fully utilized to form at least a part of a loop pipeline, such as at least one of at least a part of the pipeline unit 720 and at least a part of a liquid storage cavity 714.

The loop pipe groove 130 may be formed by punching, etching, laser engraving, turning, milling, or other ways.

In some examples, the loop pipe groove 130 is an etching groove. In this way, more loop heat pipes 700, such as a pipeline unit 720, a liquid storage cavity 714, an evaporator 710 and a one-way valve, can be formed in the middle frame 100 by the etching technology, such that the thickness size of the middle frame 100 is fully utilized to accommodate more loop heat pipes 700, which is conducive to the ultra-light and thin design of the electronic device. Furthermore, a more accurate loop heat pipe 700 can be obtained, and the reliability of the middle frame 100 can be improved.

In an example, the loop pipe groove 130 is an etching groove, and the etching groove includes a capillary groove. The loop pipe groove 130 cooperates with the sealing cover 140 to form the loop heat pipe 700. In this case, the evaporator 710 may also be directly formed on the middle frame 100 by etching, to simplify the assembling process and improve the production efficiency of the middle frame 100.

Optionally, in some examples, the sealing cover 140 and the middle frame 100 are sealed by welding. In this case, by means of the welding and sealing technology, the sealing cover 140 and the middle frame 100 can be reliably and fixedly sealed with each other, and the sealing cover 140 and the middle frame 100 can be attached to each other more closely, which is favorable for reducing the size of the middle frame 100 in a thickness direction.

Figure 15:
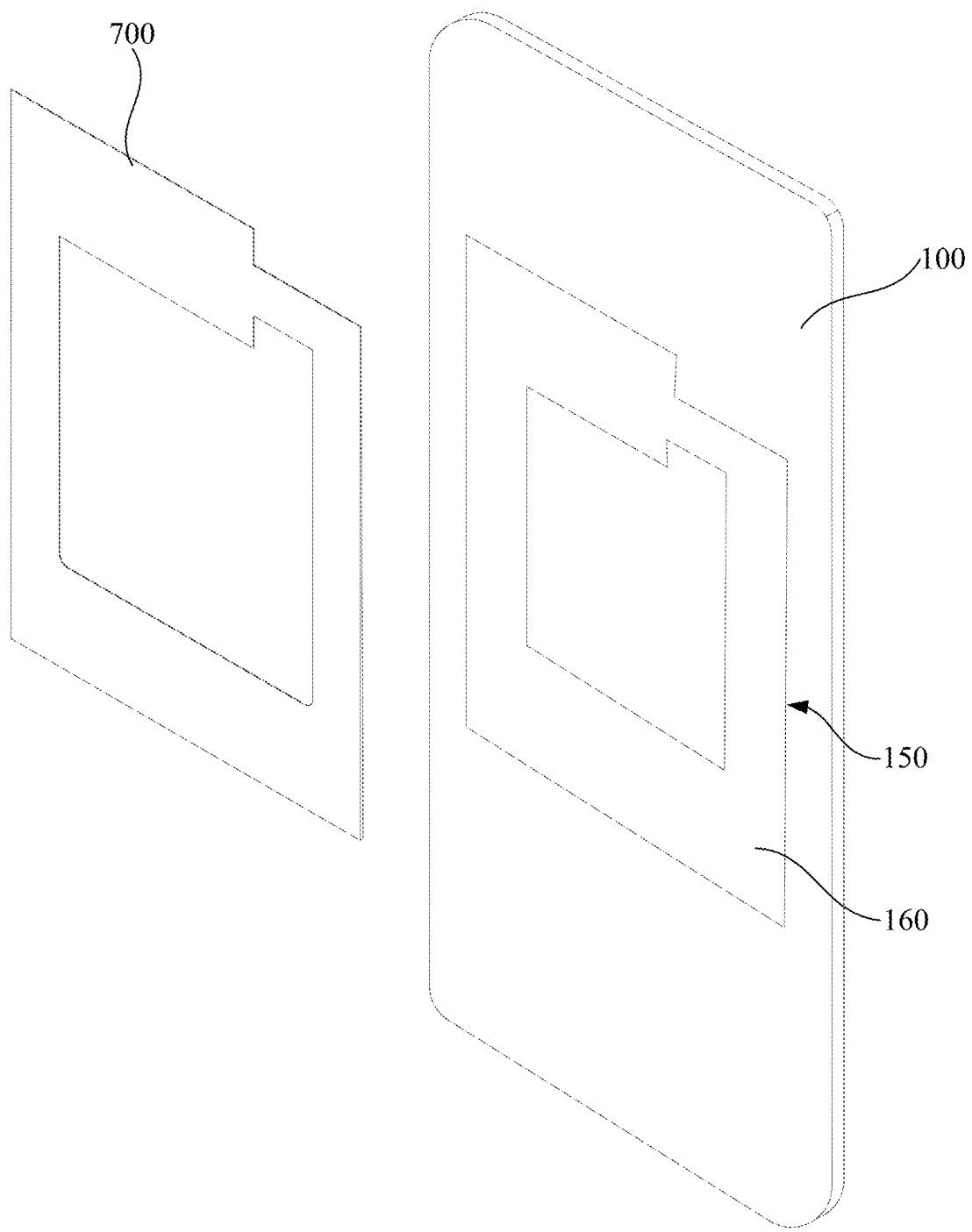
FIG. 15 is a schematic structural view of the heat dissipation component of the middle frame as shown in FIG. 9 according to another example.

On the basis of any one of the above examples, as shown in FIG. 9 or FIG. 15, in some examples, the loop heat pipe 700 is flat. In this way, the sizes of the middle frame 100 in a width direction and/or a length direction can be fully utilized to form a fluid channel, and the size of the middle frame 100 in the thickness direction can be further reduced, which is favorable for making the electronic device lighter and thinner. Furthermore, the contact area between the two parts can be increased, so that the working fluid 800 can better absorb and dissipate heat.

Optionally, the maximum thickness of the loop heat pipe 700 is less than or equal to 0.5 mm. In this case, the electronic device can adapt to the ultra-light and thin design, or increase more space for other components. For example, by means of this space, a battery with a larger volume can be accommodated, so that the endurance of the electronic device can be improved.

Optionally, the maximum thickness of the loop heat pipe 700 is less than or equal to 0.4 mm.

The thickness of the loop heat pipe 700 includes, but is not limited to, 0.5 mm, 0.45 mm, 0.4 mm, 0.35 mm and 0.3 mm.

In some examples, the evaporator 710 includes an evaporation part 713. In the projection plane of the middle frame 100 in the front-view direction, the evaporation part 713 covers the middle frame 100, and the area of the evaporation part 713 is 1.5 to 2 times the area of the middle frame 100. In this case, the evaporation part 713 can be used to fully dissipate heat from the heat source component, so that the heat dissipation of the heat source component is uniform and full, and local overheating of the heat source component is avoided.

Optionally, the evaporation part 713 includes a capillary core.

On the basis of any one of the above examples, as shown in FIG. 11 and FIG. 13, in some examples, the pipeline unit 720 includes a first delivery pipe 721, a second delivery pipe 722 and a condensation pipe 723 cooperating with the cooling part 110 in a mode of heat conduction. The condensation pipe 723 includes a cold end and a hot end. The cold end is communicated with the liquid supplementing end 711 through the first delivery pipe 721, and the hot end is communicated with the gas outlet end 712 through the second delivery pipe 722. By disposing the condensation pipe 723, a circuitous condensation channel can be formed, to make full use of the cooling part 110 for heat dissipation. Furthermore, the condensation pipe 723 cooperates with the evaporator 710 through the first delivery pipe 721 and the second delivery pipe 722 to realize the cyclic switching and orderly flow between the working fluid 800 in a liquid state and the working fluid 800 in a gas state, so that the heat dissipation reliability of the loop heat pipe 700 is higher.

On the basis of any one of the above examples, in some examples, an inner diameter of the second delivery pipe 722 is greater than an inner diameter of the first delivery pipe 721. In this case, after being vaporized, the working fluid 800 in a liquid state can quickly flow into the second delivery pipe 722 (which is easy to generate a gas flow from positive pressure to negative pressure), and can be delivered into the condensation pipe 723 for cooling, which is beneficial for the working fluid 800 in a gas state to push the working fluid 800 in a liquid state to cyclically flow.

Optionally, the inner diameter of the second delivery pipe 722 is equal to 1 time, 1.5 times, or 2 times the inner diameter of the first delivery pipe 721.

On the basis of any one of the above examples, in some examples, in the projection plane of the middle frame 100 in the front-view direction, at least a part of the condensation pipe 723 is overlapped with at least a part of the cooling part 110. In this way, the heat dissipation distance can be reduced as much as possible, and the low temperature of the cooling part 110 can be fully utilized to cool the gas in the condensation pipe 723.

On the basis of any one of the above examples, as shown in FIG. 11 and FIG. 12, in some examples, the loop heat pipe 700 further includes an anti-backflow structure 730. The anti-backflow structure 730 is disposed on the middle frame 100, so that the working fluid 800 passes through one end of the pipeline unit 720 and flows into the evaporator 710 through the anti-backflow structure 730. In this way, by means of the anti-backflow structure 730, the working fluid 800 can stably circulate according to the designed direction, so as to ensure the operating stability and reliability of the loop heat pipe 700.

The anti-backflow structure 730 includes, but is not limited to, structures such as a one-way valve.

Optionally, the anti-backflow structure is a Tesla valve structure 732.

As shown in FIG. 12 and FIG. 14, in some examples, the loop heat pipe 700 further includes Tesla valve structures 732, The Tesla valve structures 732 are disposed on the middle frame 100, so that the working fluid 800 passes through one end of the pipeline unit 720 and flows into the evaporator 710 through the Tesla valve structures 732. Due to the low forward flow resistance and high reverse flow resistance of a Tesla valve, the Tesla valve structures 732 are applied to the loop heat pipe 700 to realize the low-resistance backflow of the working fluid 800 in a liquid state, prevent the backflow of the working fluid 800 in a liquid state in the evaporator 710, and ensure that the working fluid 800 in the evaporator 710 flows with low resistance in one direction to generate driving force, thereby ensuring the stable circulation of the loop heat pipe 700.

Optionally, the output area of the Tesla valve structure 732 is generally designed to be equal to or approximately equal to the input area of the capillary core of the evaporator 710.

On the basis of any one of the above examples, in some examples, the evaporator 710 includes an evaporation part 713 disposed between the liquid supplementing end 711 and the gas outlet end 712, and the Tesla valve structure 732 is disposed between the liquid supplementing end 711 and the evaporation part 713, so that the working fluid 800 flows into the evaporation part 713 through the Tesla valve structure 732. In this case, the evaporator 710 and the Tesla valve structure 732 are coupled into a single piece, which is beneficial to the ultra-thin design, so that the loop heat pipe 700 is in the form of an ultra-thin flat plate, and the overall thickness of the loop heat pipe is less than 0.5 mm. Furthermore, the integrated structure of the evaporator 710 can be arranged flexibly. That is, multiple evaporators 710 may be correspondingly disposed according to the positions of multiple heat sources on the electronic device. Moreover, the use of the Tesla valve structures 732 among the multiple evaporators 710 can effectively prevent turbulence, so as to make the operation of each of the evaporators 710 stable, and facilitate the modular assembly, thereby being favorable for improving the production efficiency of the assembly of the middle frame 100.

On the basis of the above examples, as shown in FIG. 13 and FIG. 14, in some examples, the evaporator 710 includes a liquid storage cavity 714. The liquid storage cavity 714 is disposed between the liquid supplementing end 711 and the evaporation part 713, and a Tesla valve structure 732 is disposed in the liquid storage cavity 714. By disposing the Tesla valve structure 732 in the liquid storage cavity 714, the working fluid 800 in a liquid state can be prevented from flowing out of the evaporator 710, and the working fluid 800 in a liquid state in the liquid storage cavity 714 can be maintained, so that the evaporation part 713 can obtain the working fluid 800 in a liquid state in time to continuously generate driving force. Furthermore, when the electronic device is not used, the liquid storage cavity 714 can also store the working fluid 800 in a liquid state for the evaporation part 713 to evaporate.

On the basis of any one of the above examples of the evaporation part 713, as shown in FIG. 12 and FIG. 14, in some examples, there are at least two Tesla valve structures 732, which are disposed in parallel between the liquid supplementing end 711 and the evaporation part 713. Therefore, by using at least two Tesla valve structures disposed in parallel, the unidirectional flow guide capability of the Tesla valve structure 732 of the present disclosure can be enhanced.

Optionally, the width of the Tesla valve structure 732 is less than 1 mm, the height of the Tesla valve structure 732 is less than 0.5 mm, and the distance between two adjacent Tesla valve structures 732 is less than 1.5 mm.

As shown in FIG. 15, in some examples, the middle frame 100 is provided with a mounting groove 150 adapted to the loop heat pipe 700, and at least a part of the loop heat pipe 700 is embedded in the middle frame 100 through the mounting groove 150. In this case, the mounting groove 150 is used to accommodate at least a part of the loop heat pipe 700, so that the loop heat pipe 700 can be embedded in the middle frame 100 to reduce the thickness size of the middle frame 100.

On the basis of the above examples, in some examples, the middle frame 100 further includes a thermally conductive bonding layer 160, and at least a part of the loop heat pipe 700 is fixedly disposed in the mounting groove 150 through the thermally conductive bonding layer 160. In this case, the loop heat pipe 700 can be preliminarily placed on the mounting groove 150 and then the loop heat pipe is fixed to the mounting groove by the thermally conductive bonding layer 160, which not only improves the heat conduction efficiency of the two parts, but also facilitates the assembly of the two parts.

The loop heat pipe 700 has a long heat transfer distance and a strong anti-gravity ability, which can solve the problem that a traditional heat pipe is limited by the use orientation and length. In addition, the loop heat pipe 700 of the present disclosure separates a vapor channel from a liquid channel, and vapor and liquid are transmitted in respective pipelines (for example, the vapor flows in the first delivery pipe 721, and the liquid flows in the second delivery pipe 722), so that the occurrence of a mutual carrying phenomenon between the vapor and the liquid is prevented, and the heat dissipation reliability is high, and that the mounting of the loop heat pipe 700 is flexible and convenient and is no longer limited by the orientation and distance between a heat source and a heat sink.

Figure 16:
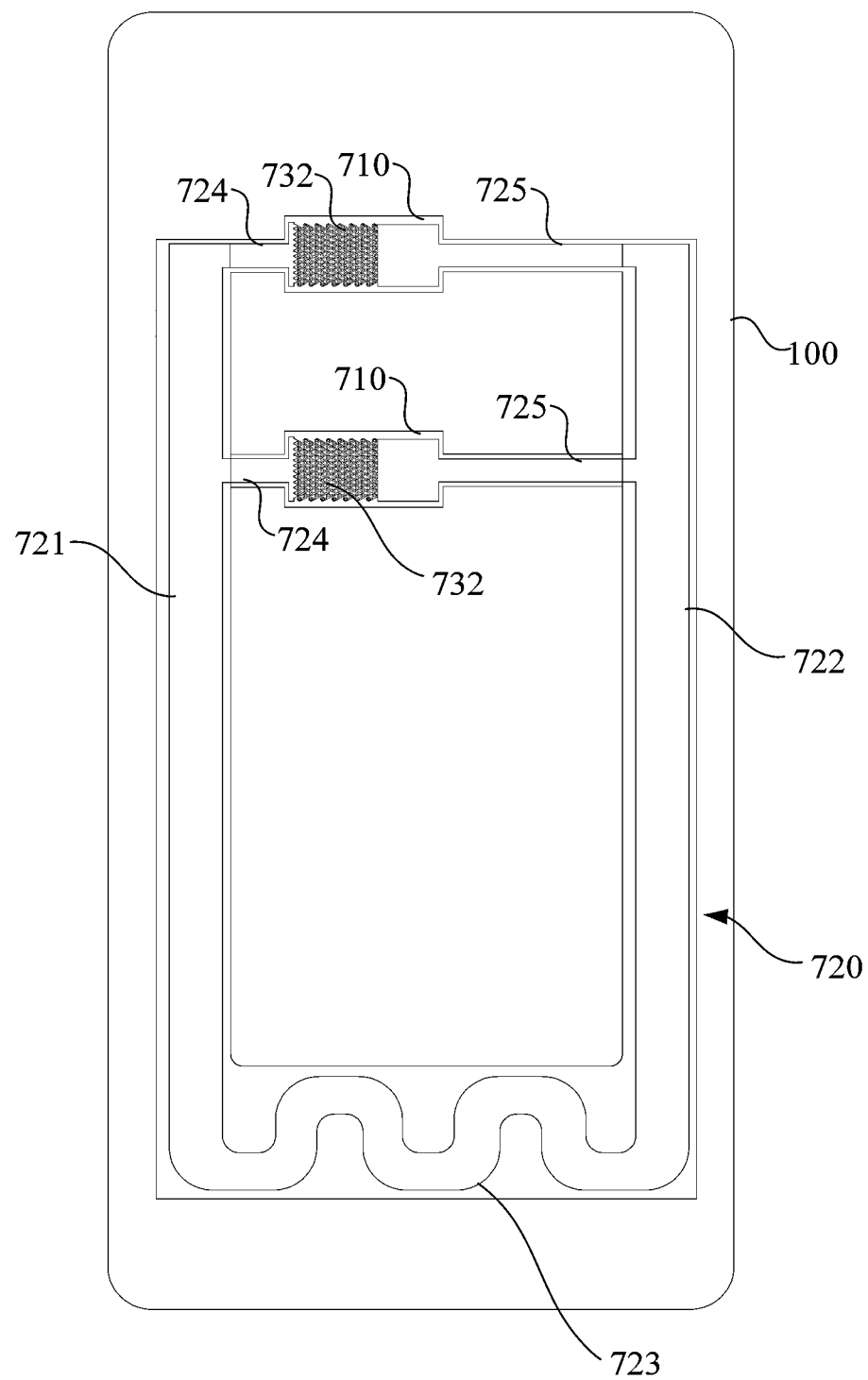
FIG. 16 is a schematic structural view of a part of a heat dissipation component of a middle frame shown in one or more examples of the present disclosure.

On the basis of any one of the above examples, as shown in FIG. 16, in some examples, more than two evaporators 710 are provided, and two adjacent evaporators 710 are disposed on the middle frame 100 at intervals. The pipeline unit 720 includes liquid supplementing branches 724 and gas outlet branches 725 corresponding to the evaporators 710 one to one. The liquid supplementing branches 724 are communicated with corresponding liquid supplementing ends 711, and the gas outlet branches 725 are communicated with corresponding gas outlet ends 712. In this way, the components of the middle frame 100 of the present disclosure can be used to actively dissipate heat from different heat source components on the electronic device, so as to further improve the heat dissipation efficiency.

By the above-mentioned Tesla valve structure 732 or anti-backflow structure 730, each of the evaporators 710 has a unidirectional flow characteristic, which can ensure that when the heat load difference is larger, the evaporators 710 can also stably improve the circulation power, and thus the stable operation of the structure with the evaporators 710 in parallel can be improved.

On the basis of any one of the above examples, in some examples, the greater the vapor generation rate between two adjacent evaporators 710, the larger the inner pipe diameter of the corresponding liquid supplementing branch 724 and/or the inner pipe diameter of the corresponding gas outlet branch 725. In this way, the working fluid 800 can be reasonably distributed, so that the compensation of the working fluid 800 in a liquid state between the evaporators 710 is smooth and sufficient, so as to improve the reliability and stability of the components of the middle frame 100 of the present disclosure during heat dissipation.

It is noted that "a body" and "a part" may be a part of the corresponding "component". That is, "a body" and "a part" are integrally formed and manufactured with "the other parts of the component"; and "a body" and "a part" may also be an independent component that can be separated from "the other parts of the component", that is, "a body" and "a part" may be independently manufactured and then combined with "the other parts of the component" into a whole. The expression of "a body" and "a part" in the present disclosure is only one of the examples, which is intended for the convenience of reading rather than limiting the scope of protection of the present disclosure. As long as the above features are included and the functions are the same, it can be understood as an equivalent technical solution of the present disclosure.

It needs to be noted that the "Tesla valve structure" may be one of the parts of the "evaporator" unit. That is, the "Tesla valve structure" may be assembled with "the other components of the evaporator" into a unit and then modularly assembled; or the "Tesla valve structure" and the "other components of the evaporator" may be independent from each other and may be mounted respectively, so that the "Tesla valve structure" may forms a whole with the "other components of the evaporator" in this device.

Equivalently, the components included in the "radiator", the "loop heat pipe" and the "electronic device" of the present disclosure may also be flexibly combined. That is, the components may be modularly produced according to actual needs and modularly assembled as an independent unit; and the components may also be assembled respectively to form a unit in this device. The division of the above components in the present disclosure is only one of the examples, which is intended for the convenience of reading rather than limiting the scope of protection of the present disclosure. As long as the above components are included and the functions are the same, it can be understood as an equivalent technical solution of the present disclosure.

In the description of the present disclosure, it is understood that orientations or position relationships indicated by terms such as "center", "longitudinal", "transverse", "length", "width", "thickness", "up", "down", "front", "rear", "left", "right", "vertical", "horizontal", "top", "bottom", "inner", "outer", "clockwise", "anticlockwise", "axial", "radial", and "circumferential" are orientations or position relationships shown based on the accompanying drawings, which are merely used for describing the present disclosure and simplifying the description, rather than indicating or implying that the referred apparatus or element must have a particular orientation or be constructed and operated in a particular orientation, and therefore, cannot be construed as a limitation to the present disclosure.

In addition, terms "first", "second" and the like are only intended for description, but cannot be construed as indicating or implying relative importance or implicitly indicating the number of the specified technical features. Thus, the features defined with "first", "second" and the like may explicitly or implicitly include at least one of the features. In the description of the present disclosure, the meaning of "multiple" is at least two, such as two and three, etc., unless otherwise specifically limited.

In the present disclosure, unless otherwise clearly specified and limited, terms "mount", "connected", "connect", "fix" and the like should be understood in a generalized manner. For example, they may be understood as fixed connection, detachable connection, or integration; or may be understood as mechanical connection, or electrical connection; or may be understood as direct connection, or indirect connection by means of a medium, or internal communication of two elements or an interaction between two elements, unless otherwise clearly specified. Those skilled in the art can understand the specific meanings of the above terms in the present disclosure according to specific situations.

In the present disclosure, unless otherwise clearly specified and defined, the first feature being disposed "above" or "below" the second feature may be understood as direct contact between the first feature and the second feature, or indirect contact between the first feature and the second feature through an intermediate. In addition, a situation that the first feature is disposed "over", "above" and "on" the second feature may be that the first feature is disposed just above or obliquely above the second feature, or only represents that the horizontal height of the first feature is greater than that of the second feature. A situation that the first feature is disposed "under", "below" and "underneath" the second feature may be that the first feature is disposed just below or obliquely below the second feature, or only represents that the horizontal height of the first feature is less than that of the second feature.

It needs to be noted that when an element is referred to as being "fixed on", "disposed on", "fixedly disposed on" or "mounted on" another component, the element may be directly on another element or there may also be an intermediate element. When an element is considered to be "connected" to another element, the element may be directly connected to another element or there may be an intermediate element. Various technical features in the foregoing examples may be randomly combined. To keep the description concise, not all possible combinations of various technical features in the foregoing examples are described. However, as long as the combinations of these technical features do not contradict each other, they may be regarded as falling within the scope of the present disclosure.

The above examples only express several implementation manners of the present disclosure and are described specifically and in detail, but they cannot be understood as limiting the range of the invention patent. It is noted that for those of ordinary skill in the art, several modifications and improvements can be made, which all fall within the scope of protection of the present disclosure, without departing from the concept of the present disclosure.

What is claimed is:

1. An electronic device, comprising:
   a middle frame, comprising a first surface;
   a heat transfer unit disposed on the first surface;
   a shielding case spaced apart from the heat transfer unit and provided with a shielding cavity;
   a heat source disposed between the heat transfer unit and the shielding case, the heat source comprising a circuit board disposed on the heat transfer unit, and a first heat source component disposed on the circuit board, wherein the first heat source component is disposed in the shielding cavity; and
   a radiator configured to dissipate heat from at least one of the shielding case or the heat source, wherein the radiator comprises a heat dissipation fan disposed toward an outer side of the shielding case,
   wherein the radiator comprises a thermal electric cooler, wherein a heat absorption part of the thermal electric cooler absorbs heat from the first heat source component in a mode of heat conduction, and a heat release part of the thermal electric cooler transfers the absorbed heat to the shielding case in a mode of heat conduction.

2. The electronic device of claim 1, wherein
   the thermal electric cooler is disposed in the shielding cavity.

3. The electronic device of claim 1, wherein the radiator comprises a passive heat dissipation structure disposed on an outer side of the shielding case.

4. The electronic device of claim 3, wherein the radiator comprises a heat dissipation fin, and the heat dissipation fan is disposed on the heat dissipation fin; or
   the passive heat dissipation structure is disposed on the outer side of the shielding case, and the heat dissipation fan is disposed on the passive heat dissipation structure.

5. The electronic device of claim 1, further comprising: a protective cover matched with a body of the middle frame to form a protective space, wherein at least a part of the radiator is detachably connected with the protective cover.

6. The electronic device of claim 5, wherein the protective cover is provided with a vent hole communicating with the protective space.

7. The electronic device of claim 6, wherein the protective cover is provided with a waterproof and gas-permeable membrane, and the waterproof and gas-permeable membrane covers the vent hole.

8. The electronic device of claim 1, wherein the heat transfer unit comprises a vapor chamber, and a phase change working medium is provided inside the vapor chamber and has a boiling point of 20° C. to 90° C.

9. The electronic device of claim 1, wherein the heat source further comprises a second heat source component, the second heat source component being disposed on an opposite surface of the circuit board relative to the first heat source component, and cooperating with the heat transfer unit in a mode of heat conduction.

10. The electronic device of claim 9, wherein the first heat source component is a resistor-capacitor unit, and the second heat source component is a Central Processing Unit (CPU).

11. The electronic device of claim 9, wherein a body of the middle frame further comprises a cooling part, and a second surface disposed opposite to the first surface; and wherein the electronic device further comprises:
- a loop heat pipe disposed on the second surface and comprising an evaporator and a pipeline unit, wherein the evaporator is disposed opposite to the second heat source component, the evaporator comprises a liquid supplementing end and a gas outlet end, a first end of the pipeline unit is communicated with the liquid supplementing end, a second end of the pipeline unit is communicated with the gas outlet end, and a part of the pipeline unit cooperates with the cooling part in a mode of heat conduction; and
- a working fluid provided in the loop heat pipe, wherein the working fluid in a liquid state is to be converted into the working fluid in a gas state by the evaporator, and the working fluid in the gas state is to flow into the pipeline unit through the gas outlet end, and wherein the working fluid in the gas state is to be re-liquefied in the pipeline unit and to be delivered into the liquid supplementing end.

12. The electronic device of claim 11, wherein the pipeline unit comprises a first delivery pipe, a second delivery pipe, and a condensation pipe cooperating with the cooling part in a mode of heat conduction, the condensation pipe comprising a cold end and a hot end, wherein the cold end is communicated with the liquid supplementing end through the first delivery pipe, and the hot end is communicated with the gas outlet end through the second delivery pipe.

13. The electronic device of claim 11, wherein the loop heat pipe further comprises an anti-backflow structure, and the anti-backflow structure is disposed on the body of the middle frame, to allow the working fluid to pass through one end of the pipeline unit and to flow into the evaporator through the anti-backflow structure.

14. The electronic device of claim 11, wherein the loop heat pipe further comprises a Tesla valve structure, and the Tesla valve structure is disposed on the body of the middle frame, to allow the working fluid to pass through one end of the pipeline unit and to flow into the evaporator through the Tesla valve structure.

15. The electronic device of claim 14, wherein the evaporator comprises an evaporation part disposed between the liquid supplementing end and the gas outlet end, and the Tesla valve structure is disposed between the liquid supplementing end and the evaporation part, to allow the working fluid to flow into the evaporation part through the Tesla valve structure.

16. The electronic device of claim 15, wherein the evaporator comprises a liquid storage cavity disposed between the liquid supplementing end and the evaporation part, and the Tesla valve structure is disposed in the liquid storage cavity.

17. The electronic device of claim 15, wherein at least two Tesla valve structures are provided and are disposed in parallel between the liquid supplementing end and the evaporation part.

18. The electronic device of claim 16, wherein at least two Tesla valve structures are provided and are disposed in parallel between the liquid supplementing end and the evaporation part.

* * * * *